(12) United States Patent
Ding et al.

(10) Patent No.: US 8,478,573 B2
(45) Date of Patent: Jul. 2, 2013

(54) MODELING CIRCUIT CELLS FOR WAVEFORM PROPAGATION

(75) Inventors: Li Ding, Sunnyvale, CA (US); Peivand Fallah-Tehrani, Camarillo, CA (US); Alireza Kasnavi, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 1794 days.

(21) Appl. No.: 11/166,659

(22) Filed: Jun. 23, 2005

(65) Prior Publication Data

US 2007/0010981 A1 Jan. 11, 2007

(51) Int. Cl.
*G06F 17/50* (2006.01)

(52) U.S. Cl.
USPC .............................. 703/14; 716/104

(58) Field of Classification Search
USPC .................................. 703/14; 716/6
See application file for complete search history.

(56) References Cited

U.S. PATENT DOCUMENTS

| | | | |
|---|---|---|---|
| 5,588,142 A * | 12/1996 | Sharrit | 703/14 |
| 5,946,482 A * | 8/1999 | Barford et al. | 703/14 |
| 6,721,929 B2 * | 4/2004 | Li et al. | 716/6 |
| 7,013,440 B2 * | 3/2006 | Croix | 716/4 |
| 7,043,709 B2 * | 5/2006 | Levy | 716/6 |
| 2005/0039151 A1 | 2/2005 | Levy | 716/6 |
| 2006/0190881 A1 * | 8/2006 | Su et al. | 716/6 |

OTHER PUBLICATIONS

I. Keller, K. Tseng, and N. Verghese, "A Robust Cell-Level Crosstalk Delay Change Analysis", In Proc.ICCAD, pp. 147-154, Nov. 2004.*
Seonghearn Lee, "Empirical nonlinear modeling for RF MOSFETs", Mar. 16, 2004, International Journal of RF and Microwave Computer-Aided Engineering, vol. 14, Issue 2, pp. 182-189.*
Alan V. Oppenheim, Alan S. Willsky, "Signal & Systems", Prentice Hall Signal Processing Series, 1997, pp. 94-103.*
Wolfram Research, Inc., "Convolution", http://web.archive.org/web/20040603232714/http://mathworld.wolfram.com/Convolution.html, Jun. 3, 2004, 5 pgs.*
Croix et al. "Blade and Razor: Cell and Interconnect Delay Analysis Using Current-Based Models", DAC Jun. 2-6, 2003, ACM, 4 pages.*
J. Croix, D. Wong, "Blade and Razor: Cell and Interconnect Delay Analysis Using Current-Based Models", DAC 2003, pp. 386-389.
Alex Gyure, Alireza Kasnavi, Sam Lo, Peivand F. Tehrani, William Shu, Mahmoud Shahram, Joddy W. Wang, Jindrich Zedja. "Noise Library Characterization for Large Capacity Static Noise Analysis Tools," ISQED, vol. 00, No., pp. 28-34, Sixth 2005.
I. Keller, K. Tseng, and N. Verghese. A Robust Cell-Level Crosstalk Delay Change Analysis. In Proc. ICCAD, pp. 147-154, Nov. 2004.
V. Zolotov, D. Blaauw, S. Sirichotiyakul, M. Becer, C. Oh, R. Panda, A. Grinshpon, and R. Levy, "Noise Propagation and Failure Criteria for VLSI Designs," in *Proc. Intl. Conf. on Computer-Aided Design*, Nov. 2002, pp. 587-594.

* cited by examiner

*Primary Examiner* — Suzanne Lo
(74) *Attorney, Agent, or Firm* — Fenwick & West LLP

(57) ABSTRACT

A model for a circuit cell used in timing and signal integrity analysis in an integrated circuit design is automatically generated. A behavioral model, such as a gate current model is used in which the current in the circuit cell is determined as a function of the input voltage and the output voltage of the circuit cell as well as the history of at least one of the current, voltage, and charge values of the circuit cell. For example, the current in the circuit cell may be a function of the history of the current, which may be calculated incrementally using recursive convolution at each time step when using the model.

19 Claims, 6 Drawing Sheets

MODELING CIRCUIT CELLS FOR WAVEFORM PROPAGATION

BACKGROUND

1. Field of the Invention

The present invention relates to the design of semiconductor chips. More specifically, the present invention relates to a method and an apparatus for generating a model for a circuit cell timing analysis and for signal intengrity analysis.

2. Related Art

Timing and signal integrity are ever increasingly important issues in integrated circuit design in the deep submicron regime. One major challenge in timing and signal integrity analysis of such deep submicron VLSI chips is to accurately model effects like interconnect crosstalk noise. Crosstalk is generally caused by capacitive or inductive coupling of adjacent conductors, which results in a distortion in the voltage waveform. Such a distortion in an input signal of a circuit cell may result in incorrect logic transitions, e.g., a gate may switch at an incorrect time, or delay variations on a signal line. The delay variation may propagate downstream and cause timing violations in other parts of the design.

For crosstalk noise analysis, conventionally table lookup based approaches are used to model noise bump propagation through a circuit cell. The propagated noises are pre-characterized at given input noise height, width, and cell load capacitance values. Detailed description on noise propagation table based methods can be found in A. Gyure, A. Kasnavi, S. Lo, P. Tehrani, W. Shu, M. Shahram, J. Wang, and J. Zejda, "Noise Library Characterization for Large Capacity Static Noise Analysis Tools," ISQED, pp. 28-34, 2005, which are incorporated herein. While being efficient in runtime, a drawback of the table lookup approach is that it requires long characterization time as well as large memory storage to accommodate the dense multi-dimensional tables that are often necessary to obtain relatively high accuracy.

Moreover, the accuracy of table lookup based approaches is not always adequate. For example, often the table lookup approaches may not explicitly model the effect of time to peak. When the time to peak is modeled, it requires an additional dimension in the lookup table, at a significant cost in storage and characterization time and still does not completely model the input noise waveform to a cell. Additionally, the table lookup approach typically uses an effective load capacitance to model cell load, which is another source of potential inaccuracy, as the effective capacitance value for crosstalk noise is often different from the effective capacitance for crosstalk delay. Even if the correct effective load capacitance value is used, a single capacitive load based table may still not be able to accurately represent the real load condition at the cell output node.

Further, table lookup based approaches are suitable only for noise propagation. Table lookup approaches are not suitable for problems such as driver weakening and the combination of propagated noise and injected noises. Detailed description on the noise combination problem can be found in, for example, V. Zolotov, D. Blaauw, S. Sirichotiyakul, M. Becer, C. Oh, R. Panda, A. Grinshpon, and R. Levy, "Noise Propagation and Failure Criteria for VLSI Designs," ICCAD, pp. 587-594, 2002, which is incorporated herein.

Alternatively, waveform propagation through circuit cells can be handled by abstracting the circuit cells using a current model. FIG. 1 illustrates a time indexed current model 10 that is conventionally used for delay calculation where the input waveform to the circuit cell is a monotonically rising or falling waveform. The current model 10 uses a current source 12 and is pre-characterized at given input slew and output load capacitance values. The currents through the output load capacitance at an array of time indexes are stored in a table, which will be used later in a simulator to derive cell output waveform. The currents are therefore modeled as a function of the following three parameters input slew, output capacitance, and time, which is described, e.g., in US patent application 2005/0039151, which is incorporated herein. Using this method to model noise waveform propagation, it is necessary to pre-characterize the current source at given input noise height, width, and load capacitance values resulting to a four-dimensional table, which becomes prohibitively expensive in storage and characterization time.

Therefore, a different modeling approach for circuit cells is needed. FIG. 2 illustrates another current model 50, which is based on input voltage and output voltage of a cell. The current model 50 uses a $V_{in}$-$V_{out}$ indexed lookup table for current source 52, an output terminal capacitance $C_{out}$, an optional Miller capacitance $C_M$, and a time shift parameter Dt, which is used for better curve fitting. For signal integrity analysis, a low pass filter 54 with a delay constant τ is also included at the input side of the cell under study. It is noted that the time shifting of the output waveform is purely empirical. Although current model 50 works for crosstalk delay calculation, it does not provide adequate accuracy for noise propagation and driver weakening effects. Current model 50 is described in more detail in J. F. Croix and D. F. Wong, "Blade and Razor: Cell and Interconnect Delay Analysis Using Current-Based Models," DAC, pp. 386-389, 2003, which is incorporated herein by reference. Another similar $V_{in}$-$V_{out}$ indexed lookup table based current model is described in I. Keller, K. Tseng, and N. Verghese, "A Robust Cell-Level Crosstalk Delay Change Analysis," ICCAD, pp. 147-154, 2004, which is also incorporated herein by reference.

Accordingly, improved cell level modeling that is suitable for various types of signal integrity analysis is desirable.

SUMMARY

In accordance with an embodiment of the present invention, a behavioral model for a circuit cell for timing and signal analysis is automatically generated by modeling the current in the circuit cell as a function of the input voltage, output voltage and the history of the current. The history of the current may be calculated incrementally using a recursive convolution at each time step when using the model. The behavioral model may be, e.g., a gate current model, which includes, e.g., an output terminal capacitor and a current source, which is a function of the input voltage, the output voltage and the history of at least one of the current, voltage, and charge of the cell.

DETAILED DESCRIPTION

Figure 1:
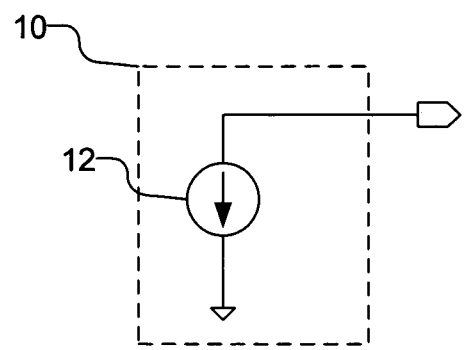
FIG. 1 illustrates a prior art time indexed current model that is conventionally used for delay calculations.
Figure 2:
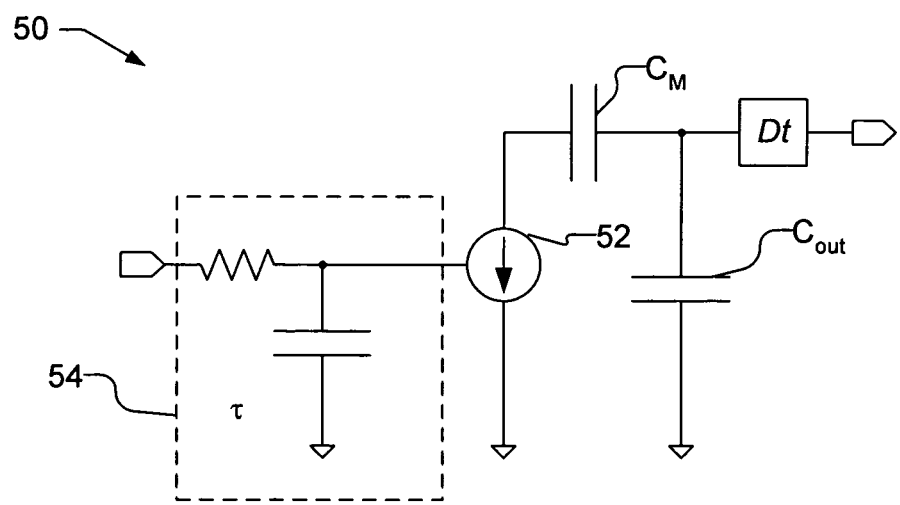
FIG. 2 illustrates a conventional circuit cell current model, which is based on input voltage and output voltage.
Figure 3:
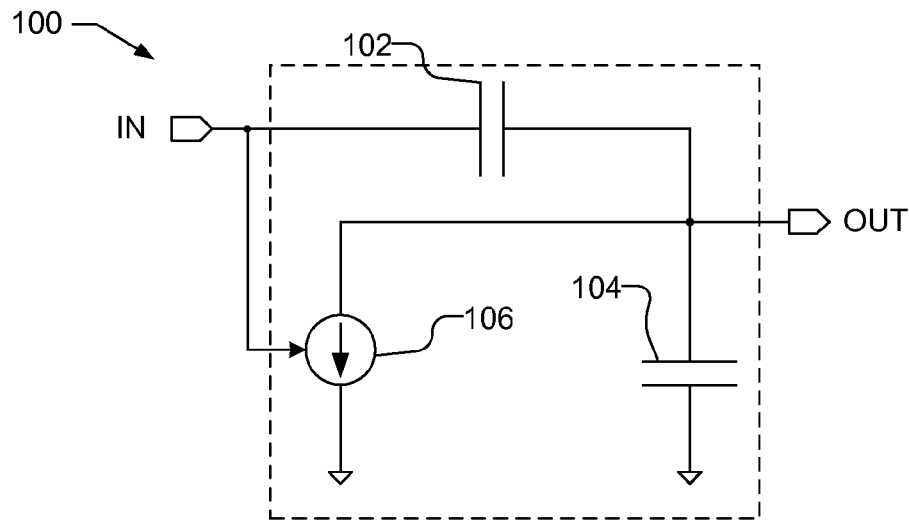
FIG. 3 schematically illustrates a current model of a circuit cell that is used in accordance with an embodiment of the present invention.

FIG. 3 schematically illustrates a current model 100 of a circuit cell that is used in accordance with an embodiment of the present invention. The current model 100 may include a Miller capacitor 102 between the input terminal IN and output terminal OUT, an output terminal capacitor 104 and a current source 106. The current of the current source 106 is a function of the cell input voltage, cell output voltage, and in one embodiment, the history of the cell current. The current history may be calculated as an integral of weighted past currents. The use of current history, input voltage, and output voltage with the current model 100 has been found to be suitable for all signal integrity analysis including, but not limited to, crosstalk delay, noise propagation, driver weakening, and combined noise propagation and noise injection.

Conventionally, the current model 100 is used as a static Vin-Vout indexed lookup table. The current that is drawn from current source 106 is conventionally a function of the instantaneous voltages at the input terminal $V_{in}$ and output terminal $V_{out}$ as follows:

$$I(t) = f(V_{in}(t), V_{out}(t)) \qquad \text{eq. 1}$$

A 2-D lookup table is used to represent the current source 106 in conventional applications. The conventional use of a current model similar to that shown in FIG. 3, is described in more detail in I. Keller, K. Tseng, and N. Verghese, "A Robust Cell-Level Crosstalk Delay Change Analysis," ICCAD, pp. 147-154, 2004, which is incorporated herein by reference.

In accordance with an embodiment of the present invention, however, the current that is drawn from the current source 106 is determined as a function the cell input voltage $V_{in}$, the cell output voltage $V_{out}$, and the history of the current. Thus, the current can be written as follows:

$$I(t) = f^*(V_{in}(t), V_{out}(t), h(t)). \qquad \text{eq. 2}$$

The history of the current h(t) can be written as follows:

$$h(t) = \int_0^t g(\tau, t) \cdot I(\tau) \cdot d\tau \qquad \text{eq. 3}$$

where $g(\tau,t)$ is a weight function, and $I(\tau)$ is the current at previous times. The history of the current can be incrementally calculated when the current model is used in a transient simulator. For example, the current in the current model may be calculated numerically as follows:

$$h(t + \Delta) = \int_0^{t+\Delta} g(\tau, t+\Delta) \cdot I(\tau) \cdot d\tau = \qquad \text{eq. 4}$$
$$\int_0^t g(\tau, t+\Delta) \cdot I(\tau) \cdot d\tau + \int_t^{t+\Delta} g(\tau, t+\Delta) \cdot I(\tau) \cdot d\tau$$

wherein $\Delta$ is the incremental change in time from the previous calculation. In one embodiment, the weight function can be a constant, i.e., $g(\tau,t)=1$, and the integral can simply be incrementally calculated with a time complexity of O(1). In another embodiment, the weight function can be an exponential function of the elapsed time t, i.e., $g(\tau,t)=p(\tau)e^{-\kappa t}$, wherein $p(\tau)$ is an arbitrary function of $\tau$ and $\kappa$ can be an arbitrary value. This reduces the integration to a recursive convolution problem and therefore can be incrementally computed with a time complexity of O(1).

Figure 4:
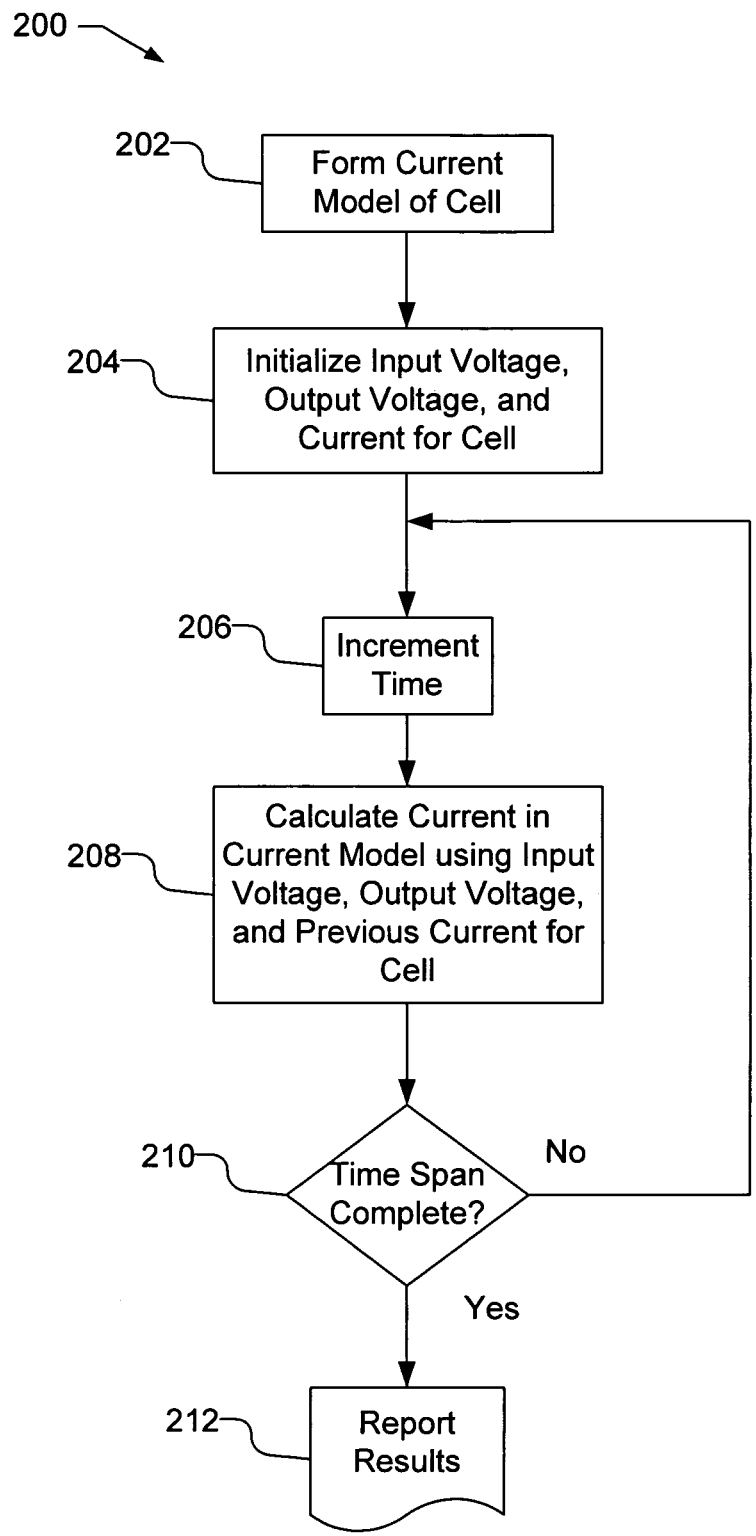
FIG. 4 is a flow chart illustrating the operation of the current model in accordance with an embodiment of the present invention.

FIG. 4 is a flow chart 200 illustrating the operation of the current model in accordance with an embodiment of the present invention. As shown in FIG. 4, a current model is generated for a cell (block 202). The current model may be, e.g., the current model 100 shown in FIG. 3, but if desired other behavioral models may be used. The cell that is modeled may be, e.g., a single logic gate, a number of logic gates, or only a portion of a logic gate. The values used in the current model, e.g., the values for the output terminal capacitor 104 and the Miller capacitor 102 (if used), can be extracted from the cell under study in a conventional fashion, which is well known in the art. In one embodiment, the value of the output terminal capacitor 104 and/or the value of the Miller capacitor 102 are extracted by curve fitting the output waveforms given a set of input waveforms.

The current model is then initialized (block 204) by providing the input voltage $V_{in}$, the initial output voltage $V_{out}$ at the beginning of the time period under study, i.e., time $t_0$. The time is then incremented (block 206), e.g., using a time stepper that is coupled to the current model in the simulator.

The current value in the current model is then calculated based on the instantaneous input voltage $V_{in}$, the output voltage $V_{out}$ and the previous current values (block 208). As discussed above, the current history in the current model may be incrementally calculated using a recursive convolution algorithm. The process of incrementing the time t (block 206) and calculating of the current (block 208) continues until the desired time span is complete (block 210).

Once the time span is complete, i.e., the time t has been incremented to the end, or desired current or voltage is reached, the calculations of the current is stopped (block 210) and the results may be reported (block 212). The results may be reported directly to an end user or to down stream processes in the simulator.

It should be understood that while the above embodiment describes the use of the history of the current in the current model, the present invention is not limited to the history of the current. The present invention may equivalently use the history of voltage or the history of the charge, as both voltage and charge have well known relationships to current.

Figure 5:
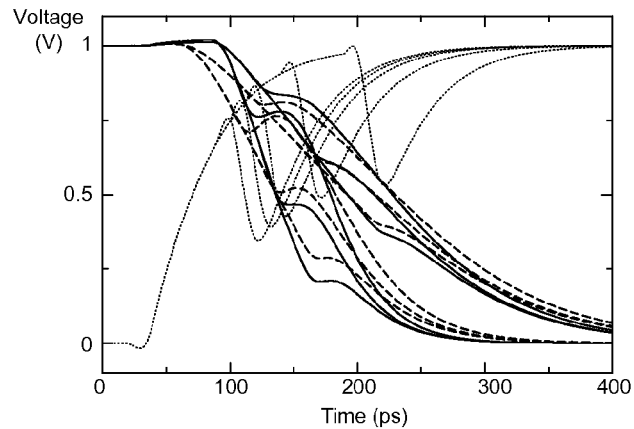
FIGS. 5 and 6 illustrate the timing analysis for cross-talk in a NAND gate using a conventional current source cell model and a current source model in accordance with an embodiment of the present invention, respectively.
Figure 6:
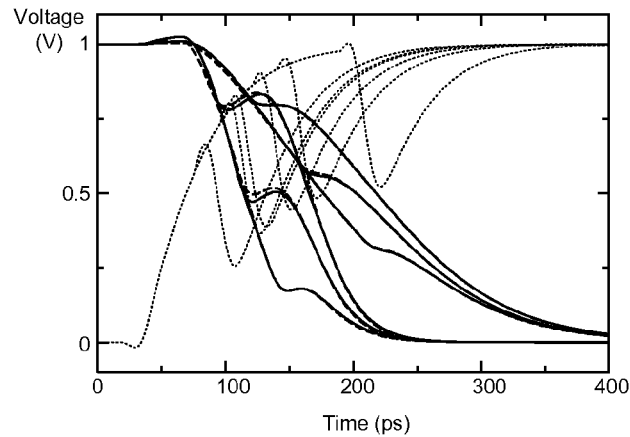

FIG. 5 illustrates the timing analysis for cross-talk delay of a conventional current source cell model of a NAND gate, which is a function of only the cell input voltage and cell output voltage. FIG. 6, similarly, illustrates the timing analysis for cross-talk delay of a current source cell model of the NAND gate, which is a function of the cell input voltage and cell output voltage and current history in accordance with an embodiment of the present invention. The dotted lines illustrate the bumpy rising input signals of the circuit cell, while the dashed lines illustrate the output signals obtained using the current source cell model and the solid lines illustrate the output signals as determined using SPICE. As can be seen in FIG. 5, the output signals determined using a conventional current source cell model do not match the SPICE output signals, whereas FIG. 6 shows good agreement between the output signals from a current source model in accordance with an embodiment of the present invention and the SPICE output signals.

Figure 7:
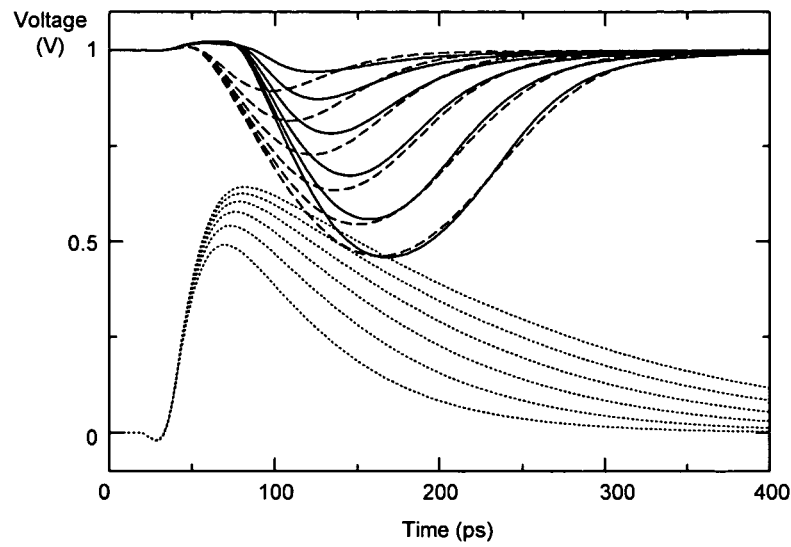
FIGS. 7 and 8 illustrate the signal integrity analysis for noise propagation in a NAND gate using a conventional current source cell model and a current source model in accordance with an embodiment of the present invention, respectively.
Figure 8:
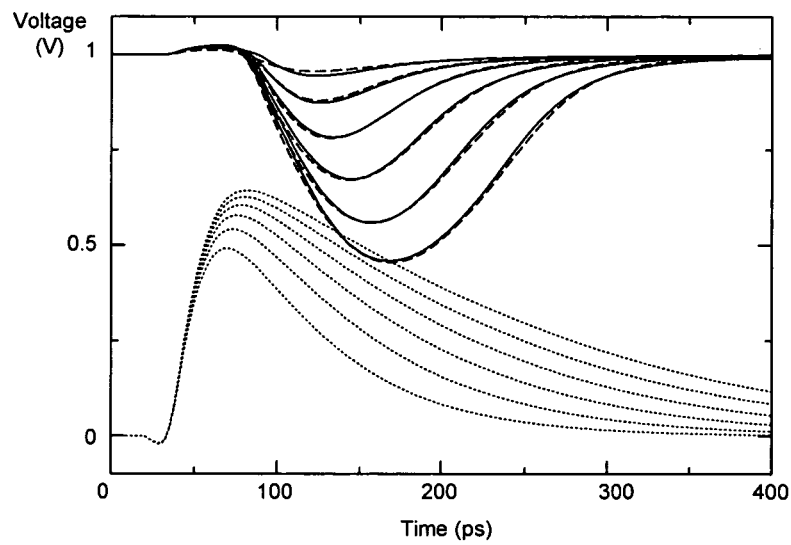

FIGS. 7 and 8 illustrate the signal integrity analysis for noise propagation in a NAND gate using a conventional current source cell model and a current source model in accordance with an embodiment of the present invention, respectively. Noise propagation analysis deals with cases when there is no injected noise at the gate output, and derives the gate output waveform from given noise bump at gate input. The dotted lines illustrate the bumpy rising input signals, while the dashed lines illustrate the output signals modeled using the current source cell model and the solid lines illustrate the output signals as determined using SPICE. As can be seen in FIGS. 7 and 8, the output signals determined using a conventional current source cell model do not match the SPICE output signals, whereas the output signals using a current source cell model in accordance with an embodiment of the present invention are in good agreement with the SPICE output signals.

Figure 9:
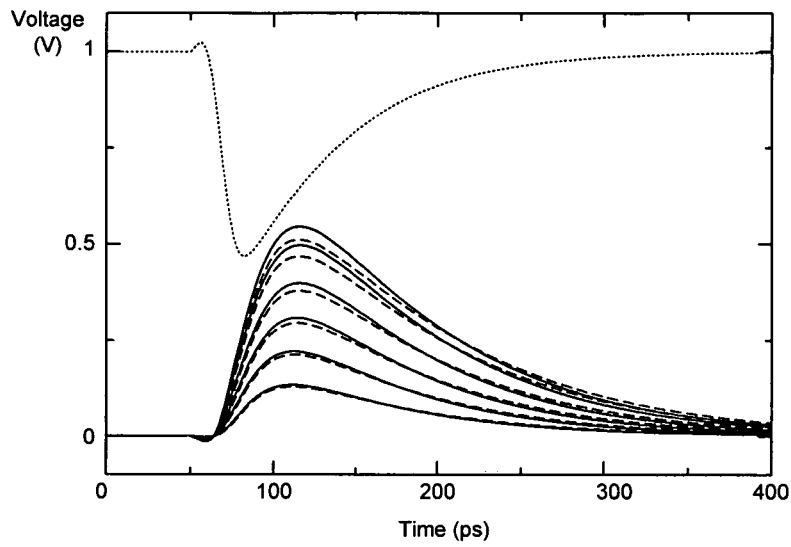
FIGS. 9 and 10 illustrate the signal integrity analysis for the driver weakening effect in a NAND gate using a conventional current source cell model and a current source model in accordance with an embodiment of the present invention, respectively.
Figure 10:
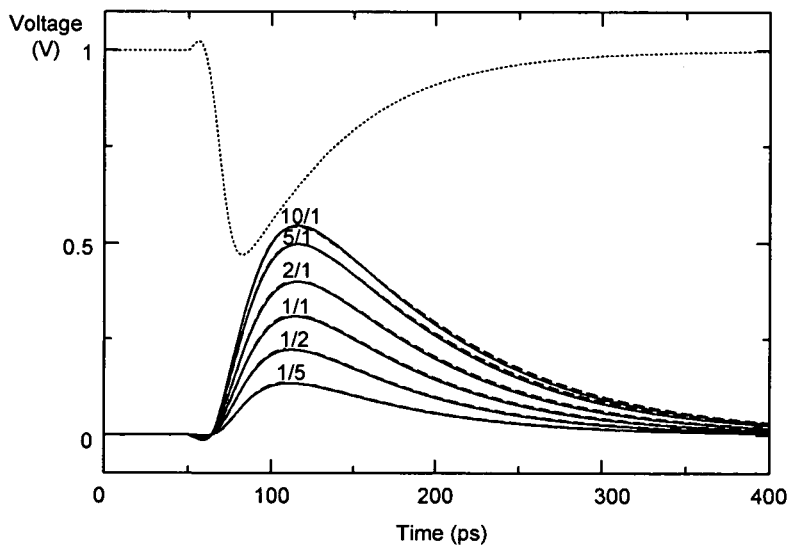

FIGS. 9 and 10 illustrate the signal integrity analysis for the driver weakening effect in a NAND gate using a conventional current source cell model and a current source model in accordance with an embodiment of the present invention, respectively. Driver weakening analysis is a special case of noise combination analysis. Noise combination analysis calculates the total output noise waveform given both a noise bump at the gate input and injected noise bumps at gate output. Driver weakening analysis calculates where the noise bump at gate input alone does not lead to significant propagated noise, but reduces the effective strength of the gate resulting in magnified injected noises at the gate output. The dotted lines illustrate the bumpy rising input signals, while the dashed lines illustrate the output signals modeled using the current source cell model and the solid lines illustrate the output signals as determined using SPICE. As can be seen in FIGS. 9 and 10, the output signals determined using a conventional current source cell model do not match the SPICE output signals, whereas the output signals using a current source cell model in accordance with an embodiment of the present invention are in good agreement with the SPICE output signals.

Thus, it can be seen that the use of the current history, along with the input and output voltages in a behavioral model, in accordance with an embodiment of the present invention, enables a more accurate noise analysis including noise propagation, noise combination and driver weakening, and therefore increases the accuracy of the timing and signal integrity analysis, relative to conventional modeling methods.

Figure 11:
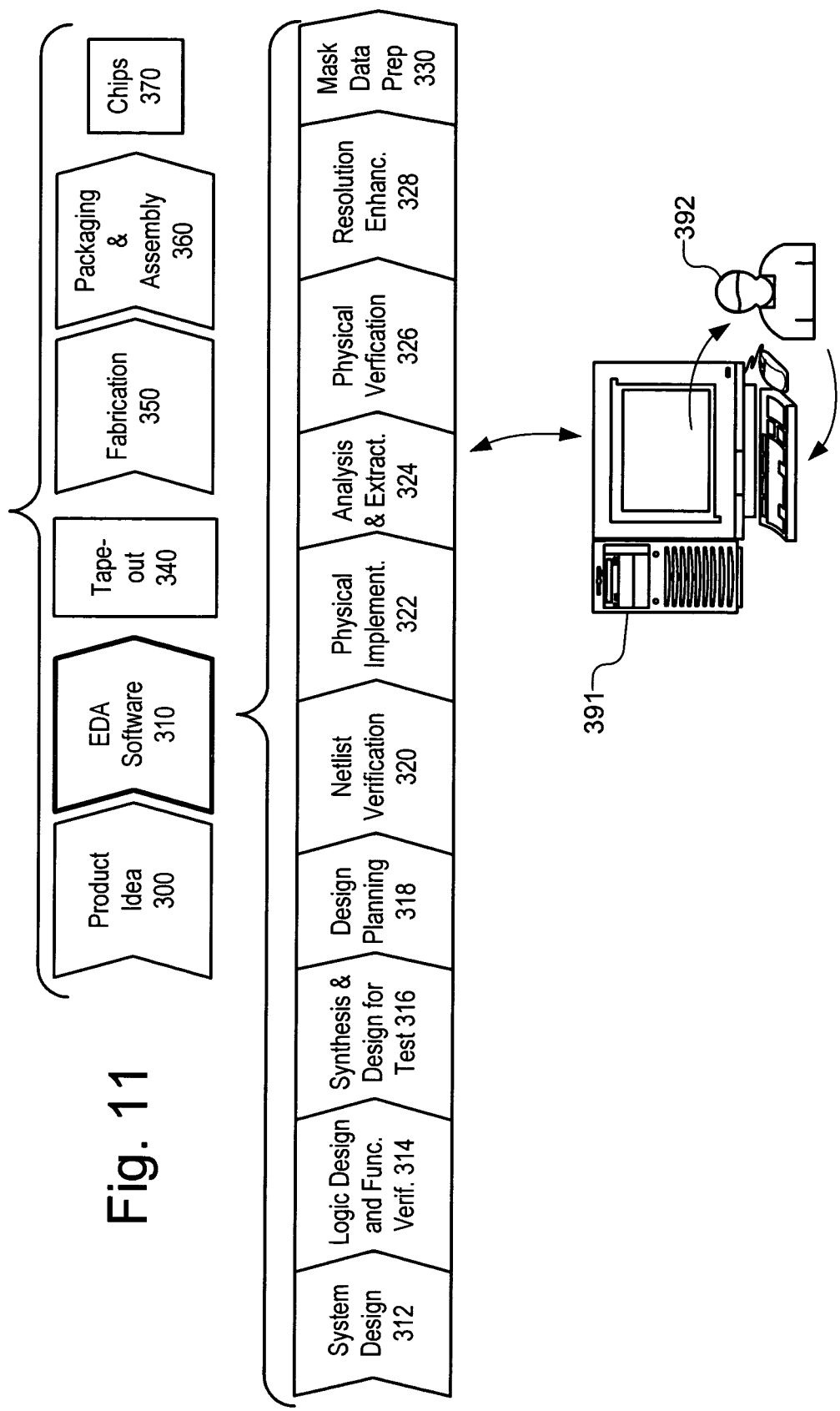
FIG. 11 shows a simplified representation of an exemplary digital ASIC design flow.

It may be helpful to place this process in context. FIG. 11 shows a simplified representation of an exemplary digital ASIC design flow. At a high level, the process starts with the product idea (300) and is realized in an EDA software design process (stage 310). When the design is finalized, it can be taped-out (event 340). After tape out, the fabrication process (350) and packaging and assembly processes (360) occur resulting, ultimately, in finished chips (result 370).

The EDA software design process (stage 310) is actually composed of a number of stages 312-330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 310) will now be provided.

In the system design stage 312, the circuit designers describe the functionality to be implemented, perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

In the logic design and functional verification stage 314, the VHDL or Verilog code for modules in the system is written and the design (which may be of mixed clock domains) is checked for functional accuracy. More specifically, the design is checked to ensure that it produces the correct outputs. Exemplary EDA software products from Synopsys, Inc. that can be used at this stage include VCS, Vera®, DesignWare®, Magellan™, Formality®, ESP and Leda® products.

In the synthesis and design for test stage 316 the VHDL/Verilog is translated to a netlist, which may be optimized for the target technology. Additionally, the design and implementation of tests to permit checking of the finished chip occurs. Exemplary EDA software products from Synopsys, Inc. that can be used at this stage include Design Compiler®, Physical Compiler®, Test Compiler, Power Compiler, FPGA Compiler, TetraMAX®, and DesignWare® products.

An overall floorplan for the chip is constructed and analyzed for timing and top-level routing in the design planning stage 318. Exemplary EDA software products from Synopsys, Inc. that can be used at this stage include JupiterXT®, Floorplan Compiler, Astro and IC Compiler products.

In the netlist verification stage 320, the netlist is checked for compliance with timing constraints and for correspondence with the VHDL/Verilog source code. Exemplary EDA software products from Synopsys, Inc. that can be used at this stage include VCS, Vera®, Formality® and PrimeTime® products.

The placement (positioning of circuit elements) and routing (connection of the same) occurs in the physical implementation stage 322. Exemplary EDA software products from Synopsys, Inc. that can be used at this stage include the Astro™ product.

At the analysis and extraction stage 324 the circuit function is verified at a transistor or cell level, this in turn permits what-if refinement. This stage includes the timing analysis and signal integrity analysis tools using the current modeling described above, as well as parasitic extraction (e.g. resistance and capacitance) tools. Exemplary EDA software products from Synopsys, Inc. that can be used at the extraction stage include Star RCXT™, Raphael, and Aurora™ products followed by tools at the analysis stage which include PrimeTime® and PrimeTime® SI.

In this stage 324, the extraction tools extract the resistance, capacitance, and cross-coupling capacitance properties of circuit elements and provide them to the analysis tools. Moreover, the analysis tools in this stage 324 produce data indicative of the effect of circuit elements on various design-specific attributes, such as timing, signal integrity, power, and electro migration. A graphical display of data from the analysis and extraction stage 324 may be provided on a video monitor of a computer 391 at which a designer 392 is working to design the integrated circuit (IC) chip. Designer 392 visually inspects the displayed results and if certain circuit elements do not satisfy a constraint (such as a timing constraint), the designer may re-design certain portions of the circuit to meet the constraint, e.g. in stage 316. Then the above-described stages 318, 320, and 322 are repeated. Reports from this stage, showing the values of design-specific attributes for certain (or all) circuit elements can be displayed to the circuit designer.

During the physical verification stage 326, various checking functions are performed to ensure correctness for: manufacturing, electrical issues, lithographic issues, and circuitry. Exemplary EDA software products from Synopsys, Inc. that can be used for this include the Hercules product.

The resolution enhancement stage 328 involves geometric manipulations of the layout to improve manufacturability of the design. Exemplary EDA software products from Synopsys, Inc. that can be used at this include iN-Phase™, Proteus, and AFGen products.

The mask data preparation stage 330 provides the "tapeout" data for production of masks for lithographic use to produce finished chips. Exemplary EDA software products from Synopsys, Inc. that can be used for this include the CATS™ family of products.

The data structures and software code for automatically implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the above described process.

Numerous modifications and adaptations of the embodiments described herein will become apparent to the skilled artisan in view of this disclosure and are encompassed by the scope of the invention.

What is claimed is:

1. A method of modeling a circuit cell in integrated circuit design; the method being performed in a computer, the method comprising:
    automatically generating a behavioral model for the circuit cell;
    automatically calculating a current in the model for the circuit cell as a function of an input voltage, an output voltage and a history of at least one of the current, voltage and charge values of the model for the circuit cell; and
    reporting the determined current in the model for the circuit cell.

2. The method of claim 1, wherein generating a behavioral model for the circuit cell comprises:
    using a gate current model for the behavioral model, the gate current model including an input terminal, an output terminal and an output terminal capacitor coupled between the output terminal and a ground terminal, and a current source that is a function of the input voltage at the input terminal, the output voltage at the output terminal, and the history of at least one of the current, voltage and charge values of the model for the circuit cell; and extracting the value of the output terminal capacitor by curve fitting the output waveforms given a set of input waveforms.

3. The method of claim 2, wherein the gate current model further includes a Miller capacitor coupled between the input terminal and the output terminal and wherein generating a behavioral model for the circuit cell further comprises extracting the value of the Miller capacitor by curve fitting the output waveforms given a set of input waveforms.

4. The method of claim 1, wherein the current in the model for the circuit cell is a function of the input voltage, the output voltage and the history of the current in the model for the circuit cell.

5. The method of claim 4, wherein the history of the current is calculated as:

$$h(t) = \int_0^t g(\tau,t) \cdot I(\tau) \cdot d\tau$$

where $g(\tau,t)$ is a weight function, and $I(\tau)$ is the current and $\tau$ is time and t is the upper limit of time.

6. The method of claim 1, wherein the history of at least one of the current, voltage and charge values of the model for the circuit cell is calculated incrementally.

7. The method of claim 1, wherein the history of at least one of the current, voltage and charge values of the model for the circuit cell is calculated using recursive convolution.

8. The method of claim 1, wherein calculating the current in the model for the circuit cell comprises:
    repeatedly incrementing time;
    determining the input voltage and the output voltage at each time increment; and
    calculating the history of at least one of the current, voltage and charge values of the model for the circuit cell at each time increment.

9. A storage device encoded with:
    instructions for:
        automatically generating a behavioral model for the circuit cell;
        automatically calculating a current in the model for the circuit cell as a function of an input voltage, an output voltage and a history of at least one of the current, voltage and charge values of the model for the circuit cell;
        reporting the determined current in the model for the circuit cell; and
    data including an initial input voltage, an initial output voltage and an initial current in the model for the circuit cell.

10. A computer comprising a processor and a memory coupled to the processor, the memory being encoded with instructions to model a circuit cell in an integrated circuit design, wherein the instructions:
    automatically generate a behavioral model for the circuit cell;
    automatically calculate a current in the model for the circuit cell as a function of an input voltage, an output voltage and a history of at least one of the current, voltage and charge values of the model for the circuit cell; and
    reporting the determined current in the model for the circuit cell.

11. The computer of claim 10, wherein the instructions to automatically generate a behavioral model for the circuit cell automatically generates a gate current model that includes an input terminal, an output terminal, an output terminal capacitor coupled between the output terminal and a ground terminal, and a current source that is a function of the input voltage at the input terminal, the output voltage at the output terminal, and the history of at least one of the current, voltage and charge values of the model for the circuit cell and automatically extracts the value of the output terminal capacitor by curve fitting output waveforms given a set of input waveforms.

12. The computer of claim 10, wherein the instructions to automatically determine the current in the model for the circuit cell determine the current as a function of the input voltage, the output voltage and the history of the current in the model for the circuit cell.

13. The computer of claim 10, wherein the history of at least one of the current, voltage and charge values of the model for the circuit cell is calculated incrementally.

14. The computer of claim 10, wherein the history of at least one of the current, voltage and charge values of the model for the circuit cell is calculated using recursive convolution.

15. An apparatus for modeling a circuit cell in an integrated circuit design, the apparatus comprising:
- a memory;
- means for generating a behavioral model for the circuit cell;
- means for initializing an input voltage, an output voltage and a current in the model for the circuit cell;
- means for repeatedly incrementing a time period during which the model for the circuit cell is modeled;
- means for determining the input voltage and the output voltage at each time increment;
- means for calculating the current in the model for the circuit cell as a function of the input voltage, the output voltage and a history of at least one of the current, voltage and charge values of the model for the circuit cell at each time increment, wherein the input voltage, the output voltage and the current values in the model for the circuit cell are stored in the memory for a plurality of time increments; and
- means for reporting the determined current in the model for the circuit cell.

16. The apparatus of claim 15, wherein the means for generating a behavioral model for the circuit cell automatically generates a gate current model that includes an input terminal, an output terminal, an output terminal capacitor coupled between the output terminal and a ground terminal, and a current source that is a function of the input voltage at the input terminal, the output voltage at the output terminal, and the history of at least one of the current, voltage and charge values of the model for the circuit cell and automatically extracts the value of the output terminal capacitor by curve fitting output waveforms given a set of input waveforms.

17. The apparatus of claim 15, wherein the means for calculating the current in the model for the circuit cell automatically calculates the history of at least one of the current, voltage and charge values of the model for the circuit cell incrementally.

18. The apparatus of claim 15, wherein the means for calculating the current in the model for the circuit cell automatically calculates the history of at least one of the current, voltage and charge values of the model for the circuit cell using recursive convolution.

19. A computer comprising a processor and a memory coupled to the processor, the memory being encoded with instructions to model a circuit cell in an integrated circuit design, wherein when executed by the processors the instructions cause the processor to perform the following:
- automatically generating a behavioral model for the circuit cell;
- automatically calculating a current in the model for the circuit cell as a function of an instantaneous input voltage, an instantaneous output voltage and a history of at least one of the current, voltage and charge values of the model for the circuit cell; and
- reporting the determined current in the model for the circuit cell.

* * * * *